(12) United States Patent
Sato et al.

(10) Patent No.: US 9,113,574 B2
(45) Date of Patent: Aug. 18, 2015

(54) WIRING BOARD WITH BUILT-IN ELECTRONIC COMPONENT AND METHOD FOR MANUFACTURING THE SAME

(71) Applicant: IBIDEN CO., LTD., Ogaki-shi (JP)

(72) Inventors: Kenji Sato, Ogaki (JP); Masahiro Zanma, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/063,052

(22) Filed: Oct. 25, 2013

(65) Prior Publication Data

US 2014/0116763 A1 May 1, 2014

(30) Foreign Application Priority Data

Oct. 25, 2012 (JP) .................................. 2012-235782

(51) Int. Cl.
*H05K 1/00* (2006.01)
*H05K 1/18* (2006.01)
*H05K 3/46* (2006.01)

(52) U.S. Cl.
CPC .............. *H05K 1/186* (2013.01); *H05K 3/4697* (2013.01); *H05K 3/4644* (2013.01); *H05K 2201/09827* (2013.01); *H05K 2201/10015* (2013.01); *H05K 2201/10636* (2013.01); *Y10T 29/49146* (2015.01)

(58) Field of Classification Search
USPC .......... 174/260, 255, 258, 261; 361/748, 761; 29/829, 841; 439/68
See application file for complete search history.

(56) References Cited

U.S. PATENT DOCUMENTS

| | | | | |
|---|---|---|---|---|
| 5,889,445 | A * | 3/1999 | Ritter et al. | 333/172 |
| 8,299,366 | B2 * | 10/2012 | Sato et al. | 174/260 |
| 8,466,372 | B2 * | 6/2013 | Sakai et al. | 174/260 |
| 2003/0087538 | A1 * | 5/2003 | Ueno | 439/68 |
| 2004/0239349 | A1 * | 12/2004 | Yamagishi et al. | 324/754 |
| 2006/0223307 | A1 * | 10/2006 | Gotoh et al. | 438/640 |
| 2008/0277150 | A1 * | 11/2008 | Takashima et al. | 174/260 |
| 2009/0188703 | A1 * | 7/2009 | Ito et al. | 174/255 |

(Continued)

FOREIGN PATENT DOCUMENTS

| | | |
|---|---|---|
| JP | 2001-345560 | 12/2001 |
| JP | 2009-105345 | 5/2009 |
| JP | 2012-079994 | 4/2012 |

OTHER PUBLICATIONS

U.S. Appl. No. 14/063,036, filed Oct. 25, 2013, Sato, et al.

*Primary Examiner* — Xiaoliang Chen
(74) *Attorney, Agent, or Firm* — Oblon, McClelland, Maier & Neustadt, L.L.P.

(57) ABSTRACT

A wiring board with a built-in electronic component includes a core substrate having a cavity, an electronic component accommodated in the cavity of the core substrate and having a body portion and multiple conductive portions formed on a surface of the body portion, a filling resin filling the space formed in the cavity having the component positioned in the cavity, and an resin insulation layer formed on the core substrate such that the resin insulation layer is covering an opening of the cavity and a surface of the component. The core substrate has an inclination suppressing structure formed on one or more side walls forming the cavity such that the distance between the side wall forming the cavity and the component varies in a portion of the side wall having the inclination suppressing structure and a portion of the side wall other than the portion having the inclination suppressing structure.

10 Claims, 8 Drawing Sheets

(56) References Cited

U.S. PATENT DOCUMENTS

| | | | |
|---|---|---|---|
| 2010/0059876 A1* | 3/2010 | Shimizu et al. | 257/700 |
| 2010/0078205 A1* | 4/2010 | Sakai et al. | 174/260 |
| 2010/0128411 A1* | 5/2010 | Onishi et al. | 361/302 |
| 2010/0300737 A1* | 12/2010 | Sato et al. | 174/260 |
| 2011/0128665 A1* | 6/2011 | Nies | 361/301.4 |
| 2011/0291293 A1* | 12/2011 | Tuominen et al. | 257/774 |
| 2012/0080221 A1* | 4/2012 | Sekine | 174/260 |
| 2012/0142147 A1* | 6/2012 | Sakai et al. | 438/118 |
| 2012/0186861 A1* | 7/2012 | Shimizu et al. | 174/255 |
| 2012/0188734 A1* | 7/2012 | Mikado et al. | 361/761 |
| 2012/0241205 A1* | 9/2012 | Shimizu | 174/260 |
| 2012/0287586 A1* | 11/2012 | Mikado et al. | 361/748 |
| 2013/0081866 A1* | 4/2013 | Furutani et al. | 174/260 |
| 2013/0194764 A1* | 8/2013 | MIKADO et al. | 361/761 |
| 2014/0048321 A1* | 2/2014 | Sugiyama et al. | 174/260 |

* cited by examiner

WIRING BOARD WITH BUILT-IN ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2012-235782, filed Oct. 25, 2012, the entire contents of which are incorporated herein by reference.

BACKGROUND OF THE INVENTION

1. Field of the Invention

The present invention relates to a wiring board having a built-in electronic component, and a method of manufacturing the same.

2. Description of Background Art

Japanese Laid-Open Patent Publication No. 2001-345560 describes an example of a product in which an electronic component is mounted in the cavity of a wiring board. The entire contents of this publication are incorporated herein by reference.

SUMMARY OF THE INVENTION

According to one aspect of the present invention, a wiring board with a built-in electronic component includes a core substrate having a cavity portion, an electronic component accommodated in the cavity portion of the core substrate and having a body portion and multiple conductive portions formed on a surface of the body portion, a filling resin filling the space formed in the cavity portion having the electronic component positioned in the cavity portion, and an resin insulation layer formed on the core substrate such that the resin insulation layer is covering an opening of the cavity portion and a surface of the electronic component. The core substrate has an inclination suppressing structure formed on one or more side walls forming the cavity portion such that the distance between the side wall forming the cavity portion and the electronic component varies in a portion of the side wall having the inclination suppressing structure and a portion of the side wall other than the portion having the inclination suppressing structure.

According to another aspect of the present invention, a method of manufacturing a wiring board with a built-in electronic component includes preparing a core substrate having a cavity portion and an inclination suppressing structure formed on one or more side walls forming the cavity portion, disposing an electronic component in the cavity portion of the core substrate such that the distance between the side wall forming the cavity portion and the electronic component varies in a portion of the side wall having the inclination suppressing structure and a portion of the side wall other than the portion having the inclination suppressing structure, and supplying a filling resin in the space formed in the cavity portion having the electronic component positioned in the cavity portion such that the filling resin fills the space formed in the cavity portion having the electronic component positioned in the cavity portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
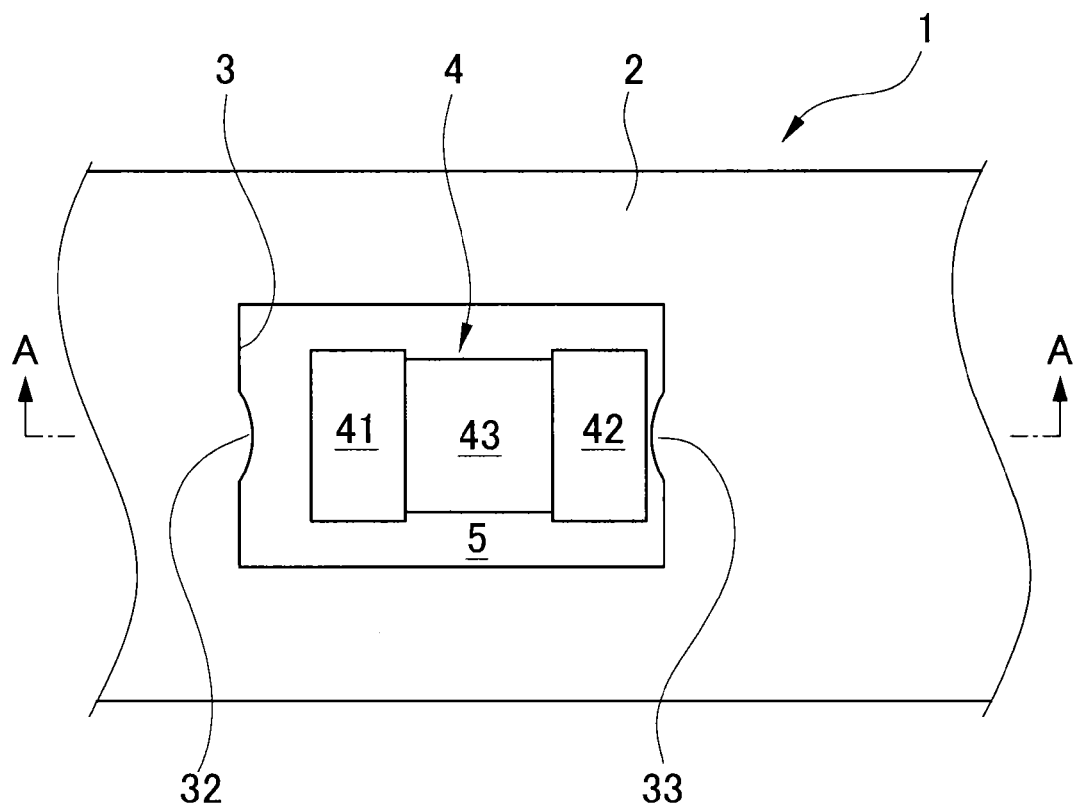
FIG. 1 is a perspective plan view showing a wiring board with a built-in electronic component according to an embodiment of the present invention.

The embodiments will now be described with reference to the accompanying drawings, wherein like reference numerals designate corresponding or identical elements throughout the various drawings.

Figure 2:
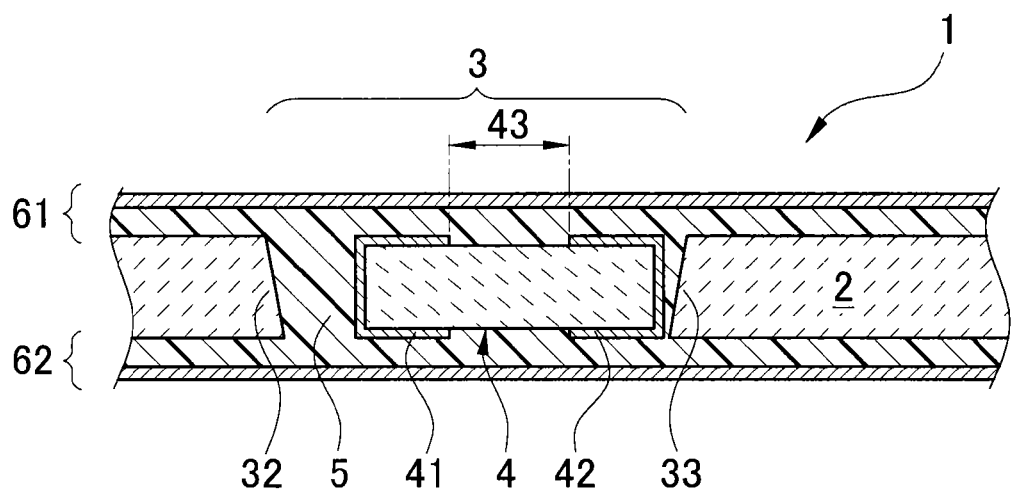
FIG. 2 is a cross-sectional view of the wiring board with a built-in electronic component according to the embodiment of the present invention.

A wiring board with a built-in electronic component according to an embodiment of the present invention is structured as shown in a plan view of FIG. 1 and a cross-sectional view of FIG. 2. As shown in FIG. 1, the wiring board 1 with a built-in electronic component according to the present embodiment has a rectangular cavity 3 formed in a portion of a core wiring board 2 and has an electronic component 4 positioned in the cavity 3. The core wiring board 2 is a well-known wiring board formed by laminating conductive layers and insulation layers. The cavity 3 is a through hole formed by boring through a portion of the core wiring board 2. Protrusions (32, 33) partially protruding toward the electronic component 4 are formed on two opposite sides of the cavity. The electronic component 4 is accommodated in the cavity 3 in the wiring board 1 with a built-in electronic component of FIG. 1. Within the cavity 3, portions other than the portion occupied by the electronic component 4 are filled with filling resin 5.

The electronic component 4 is a Multi-Layer Ceramic Capacitor (MLCC) in the present embodiment. Hereinafter, it is referred to as MLCC 4. The MLCC 4 has an overall rectangular flat plate shape. The MLCC 4 has regions with a surface covered by electrodes (41, 42) at respective ends in a longitudinal direction. Electrodes (41, 42) are conductive portions connected to inner conductors of the MLCC 4. The electrodes (41, 42) are arranged along one shorter side and its opposite shorter side of the MLCC 4. A region 43 not covered by the electrodes exists between the electrodes (41, 42). The electronic component 4 is arranged in the cavity 3 in such a manner that both ends of the electronic component 4 in a longitudinal direction, i.e., both sides covered by the electrodes (41, 42), face the protrusions (32, 33) on the wall surface of the cavity 3.

The cross-sectional view of FIG. 2 illustrates a position along line (A-A) in FIG. 1. As understood from FIG. 2, an upper surface and a lower surface of the wiring board 1 with a built-in electronic component according to the present embodiment are covered by upper layers (61, 62). The upper layers (61, 62) cover main surfaces (upper surfaces and lower surfaces of the core wiring board 2 and MLCC 4 in FIG. 2) of the core wiring board 2 and the MLCC 4. The details of the upper layers (61, 62) are described below. Some portions of the core wiring board 2 of FIG. 2 which are positioned to face the electrodes (41, 42) of the MLCC 4 are the protrusions (32, 33) described above.

A manufacturing process of the wiring board 1 with a built-in electronic component according to an embodiment of the present invention is described below. The manufacturing process of the wiring board 1 with a built-in electronic component includes the following steps. The process is described as follows.

Preparation of Core Wiring Board

Figure 3:
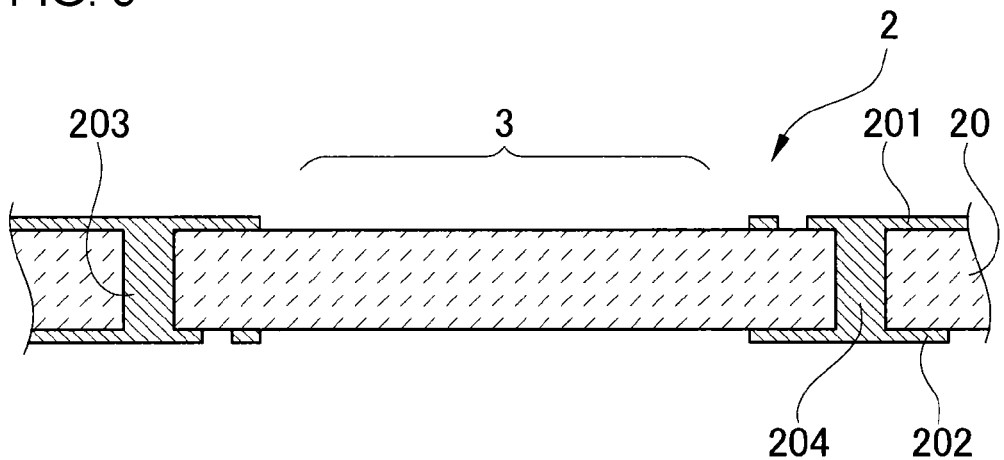
FIG. 3 is a cross-sectional view of a core wiring board used as a start material in the embodiment of the present invention.
Figure 4:
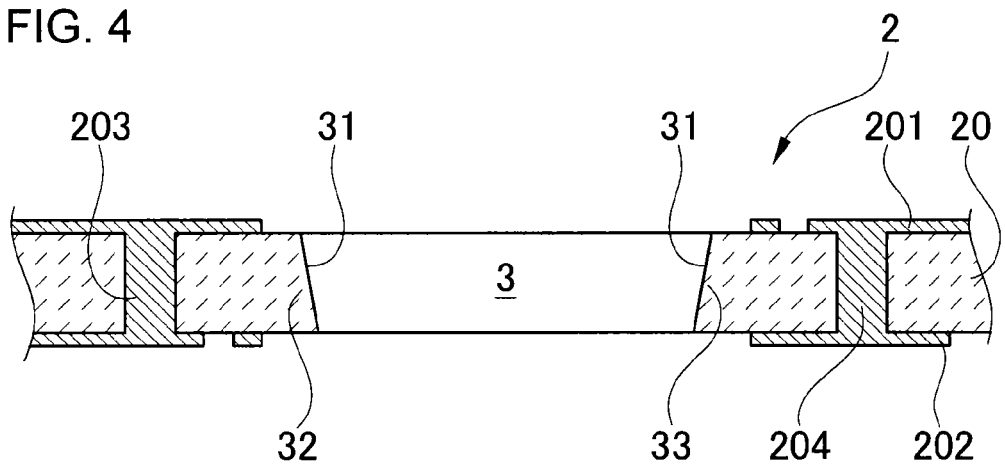
FIG. 4 is a cross-sectional view of the core wiring board in which a cavity is formed.

A core wiring board 2 used as a starting material in the present embodiment is shown in FIG. 4 and obtained by forming a cavity 3 in a laminated wiring board 20 as shown in FIG. 3. The cavity 3 is a through hole that has openings in the respective surfaces of the laminated wiring board 20. The laminated wiring board 20 of FIG. 3 is a well-known wiring board formed by laminating conductive layers and insulation layers. Wiring patterns (201, 202) are formed respectively in the front and back surfaces of the laminated wiring board 20. An upper layer is laminated on the wiring patterns (201, 202) so that the wiring patterns (201, 202) will become inner-layer patterns.

Aside from the wiring patterns (201, 202), inner wiring patterns may also be formed in the laminated wiring board 20. However, neither the wiring patterns (201, 202) nor the inner wiring patterns exist within a region 30 in which the cavity 3 is formed. In the laminated wiring board 20 of FIG. 3, filled through holes (203, 204) are formed in positions within a region other than the region 30. The filled through holes (203, 204) electrically conduct between the wiring patterns (201, 202).

The cavity 3 is formed by boring through the region 30 of the laminated wiring board 20 of FIG. 3. This results in the state shown in FIG. 4. The cavity 3 is a through hole that penetrates through the laminated wiring board 20 in a thickness direction. An example of a method of boring the cavity 3 is laser beam machining, which emits a laser beam to a position corresponding to the contour of the cavity 3. When the cavity 3 is formed by irradiating a laser, a wall surface 31 of the cavity 3 becomes an inclined surface open toward a light source (see FIG. 4). Through this hole-making process, the protrusions (32, 33) shown in FIG. 1 are also formed. That is, the protrusions (32, 33) are part of the laminated wiring board 20, and are not additionally added. In other words, the protrusions (32, 33) are sectioned by a cut plane formed when a portion of the laminated wiring board corresponding to the cavity 3 is removed from the laminated wiring board 20. Accordingly, the number of parts and process steps is reduced. The protrusions (32, 33) do not fall out from the laminated wiring board 20.

Inner-Layer Surface Treatment

Next, an inner-layer surface treatment is performed with respect to the laminated wiring board 20 having the cavity 3 formed therein. That is, a surface roughening treatment for roughening the wiring patterns (201, 202) on the surfaces of the laminated wiring board 20 is performed. This treatment is to improve adhesion between the interlayer insulation layers to be formed in the following step and the wiring patterns (201, 202). Specifically, the laminated wiring board 20 is immersed in a soft etching agent containing sulfuric acid and hydrogen peroxide. Here, a commercially available surface roughening agent for copper and the like is used, and generally used treatment conditions are employed.

Tape Lamination

Figure 5:
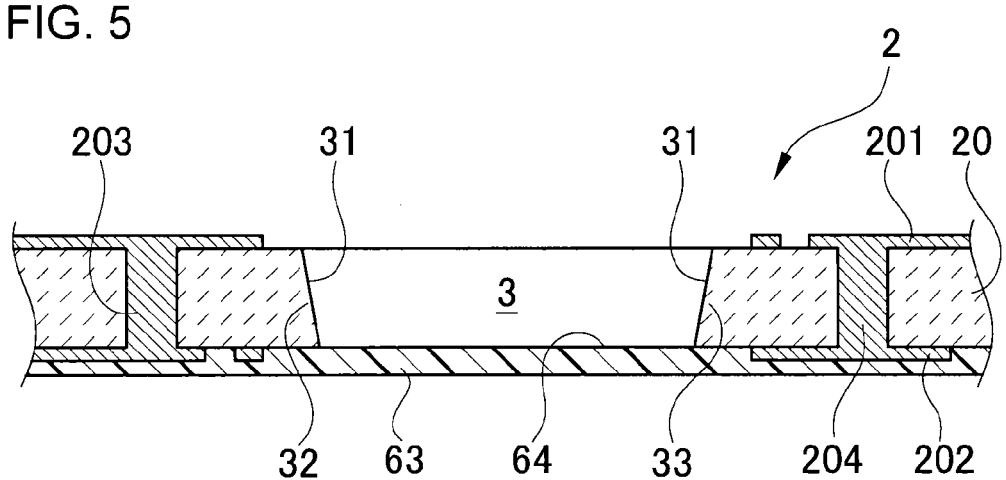
FIG. 5 is a cross-sectional view of the core wiring board to which adhesive tape is laminated.

Subsequently, adhesive tape 63 is laminated on the laminated wiring board 20 which has undergone the surface roughening treatment, resulting in the state shown in FIG. 5. This step is to preliminarily affix the MLCC 4 when the MLCC 4 is accommodated in the cavity 3. Therefore, as the adhesive tape 63, single-sided adhesive tape where only one side is an adhesive surface 64 is used. The adhesive tape 63 is laminated in such a manner that the adhesive surface 64 faces the laminated wiring board 20. Thereby, one end of the cavity 3 of the laminated wiring board 20 will be closed by the adhesive tape 63. That is, the adhesive tape 63 serves as the bottom of the cavity 3, and the adhesive surface 64 is exposed in the bottom of the cavity 3. The adhesive tape 63 laminated here will be removed later, and does not remain in a final product.

Mounting of MLCC

Subsequently, the MLCC 4 is mounted on the laminated wiring board 20 after the lamination, resulting in the state shown in FIG. 6. That is, the MLCC 4 is accommodated in the cavity 3 of the laminated wiring board 20. Thereby, the MLCC 4 is pasted to the adhesive surface 64 of the adhesive tape 63, so that the MLCC 4 is unlikely to be accidently removed. This state is a preliminary fixed state.

Here, the position of the MLCC 4 within the cavity 3 varies to a certain degree. That is, the MLCC 4 is not necessarily located in the center of the cavity 3. Within the cavity 3, the MLCC 4 may be positioned off center in a board surface direction of the laminated wiring board 20. In the example of FIG. 6, the MLCC 4 is positioned off center to be closer to the right side of the cavity 3. That is, the distance between a wall surface 31 of the cavity 3 and the MLCC 4 is not uniform on the left and right sides of the MLCC 4. A distance (S1) on the right side where the protrusion 33 is formed is greater than a distance (S2) on the left side where the protrusion 32 is formed.

Figure 6:
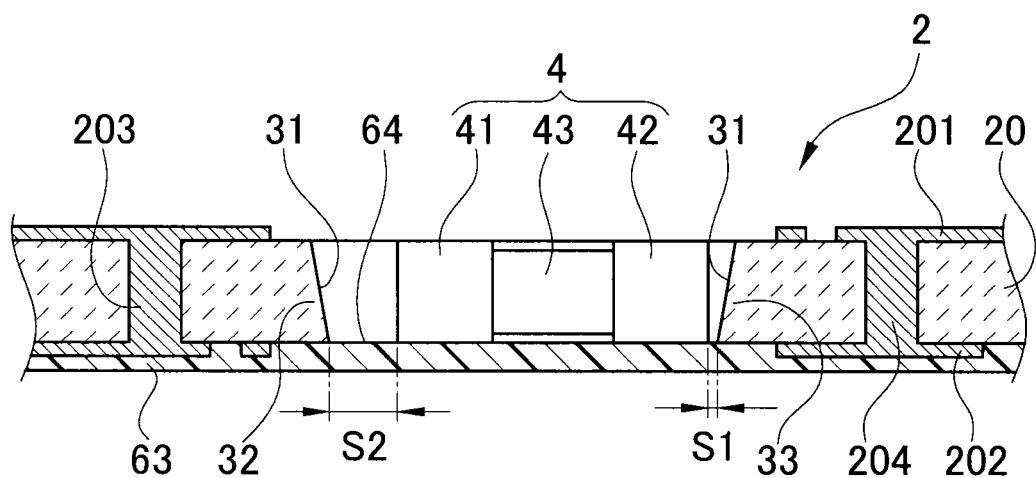
FIG. 6 is a cross-sectional view of the core wiring board in which an MLCC is mounted.
Figure 7:
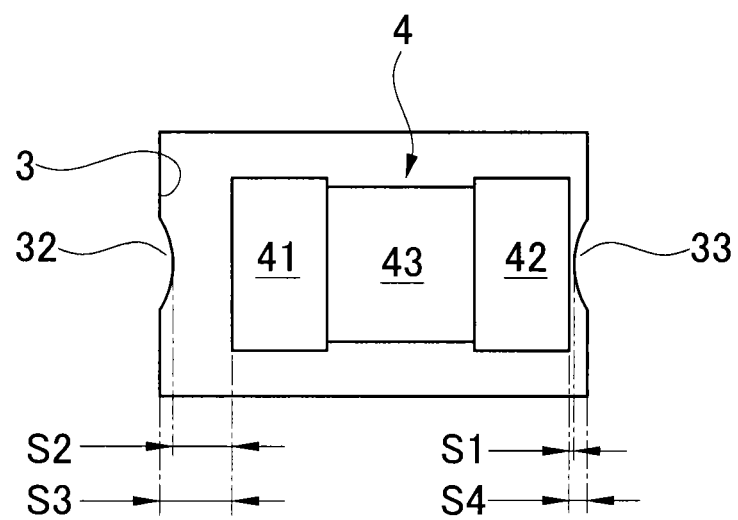
FIG. 7 is a plan view illustrating a distance between the MLCC and the wall surface of the cavity.

The distances (S1) and (S2) as shown in FIG. 6 are distances between the MLCC 4 and the wall surface 31 of the cavity 3 in positions corresponding to the protrusions (32, 33), respectively. Therefore, on the sides where the protrusions (32, 33) are formed, the distances between the MLCC 4 and the wall surface 31 differ in a position where the protrusions (32, 33) are present and in a position where no protrusion is present. The distance in the positions where the protrusions (32, 33) are not formed is greater. That is, as shown in FIG. 7, a distance (S4) is greater than the distance (S1), and a distance (S3) is greater than the interval (S2). The distance (S4) is a distance in a position other than the position of the protrusion 33, on the side where the protrusion 33 is present. Similarly, the distance (S3) is a distance in a position other than the position of the protrusion 32, on the side where the protrusion 32 is present. For this reason, the difference between the distances on the left and right sides of the MLCC 4 is reduced by the existence of the protrusions (32, 33). A ratio of (S4) to (S3) is set close to 1, as compared with a ratio of (S1) to (S2).

First Lamination

Figure 8:
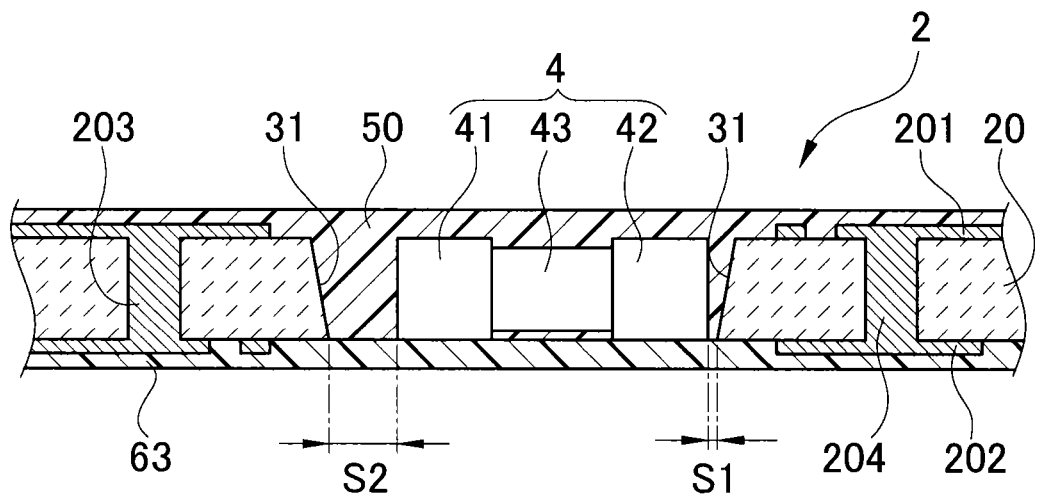
FIG. 8 is a cross-sectional view of the core wiring board that has undergone a first lamination.

Next, an upper interlayer insulation layer is laminated. Here, laminating a surface on the opposite side of the adhesive tape 63 is first performed as a first lamination. Thus, as shown in FIG. 8, an upper interlayer insulation layer 50 is laminated on a surface of the laminated wiring board 20 opposite the adhesive tape 63. For this reason, a resin film is laminated on the same surface of the laminated wiring board 20. In this state, the upper interlayer insulation layer 50 covers each of the main surfaces of the laminated wiring board 20 and the MLCC 4. For the resin film, an epoxy resin or other thermosetting resins, which are not cured, are used. In particular, a resin of a semi-cured state called B stage is preferred, and a resin film that does not contain glass cloth (core member) is also preferred. Moreover, it is preferable to perform this lamination under reduced pressure.

Subsequently, the laminated wiring board 20 and the resin film laminated on the laminated wiring board 20 are pressed in a thickness direction. This pressing forces some of the resin from the resin film into a gap between the wall surface 31 and the MLCC 4 positioned in the cavity 3. In this way, the gap is filled with the filling resin 5. That is, the filling resin 5 is originally part of the resin of the resin film. The portion of the resin film that was not filled into the gap and remains on the surface of the laminated wiring board 20 or the MLCC 4 becomes the upper interlayer insulation layer 50. Therefore, the filling resin 5 is contiguous to the upper interlayer insulation layer 50 without forming an interface.

Pressure and temperature for the pressing are set to levels at which the resin of the upper interlayer insulation layer 50 and the filling resin 5 will not be cured. FIG. 8 shows the state after such pressing. The thickness of the upper interlayer insulation layer 50 after the pressing is approximately 10 to 20 μm.

Second Lamination

Next, a second lamination of an upper interlayer insulation layer is performed. That is, an upper interlayer insulation layer is laminated on a surface of the laminated wiring board opposite the surface on which the upper interlayer insulation layer 50 has been laminated through the first lamination. The adhesive tape 63 is removed prior to such a process. Since adhesion of the adhesive tape 63 itself is not so strong, the adhesive tape 63 can be easily stripped off from the laminated wiring board 20. At this time, the MLCC 4 remains in the cavity 3 of the laminated wiring board 20 without being removed from the laminated wiring board 20 when the adhesive tape 63 is stripped off. That is, the MLCC 4 is separated from the adhesive tape 63. While only one surface of the MLCC 4 is held by the adhesive tape 63, all of the other surfaces of the MLCC 4 are held by the upper interlayer insulation layer 50 and the filling resin 5.

Figure 9:
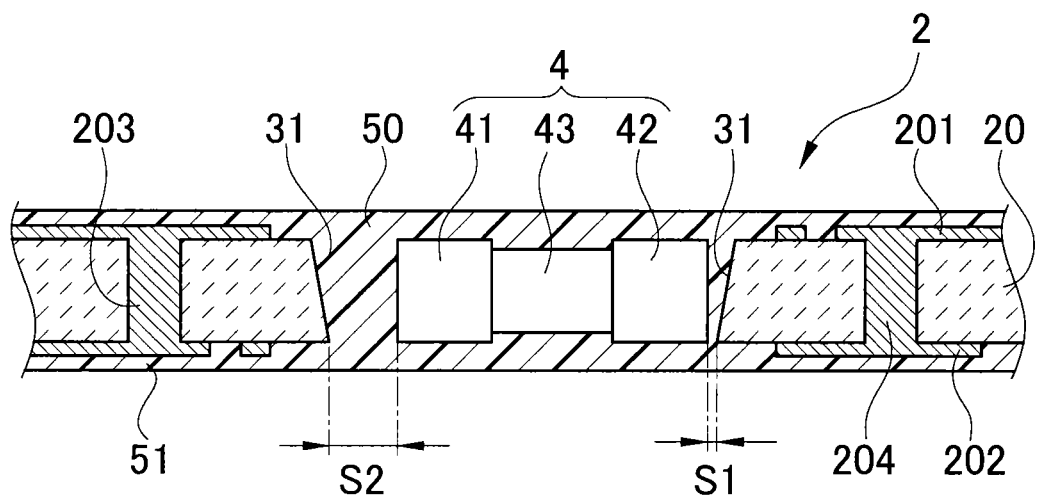
FIG. 9 is a cross-sectional view of the core wiring board that has undergone a second lamination.

Subsequently, a resin film is laminated on the surface of the laminated wiring board 20 from which the adhesive tape 63 has been removed. As shown in FIG. 9, this results in the upper interlayer insulation layers (50, 51) being laminated on respective surfaces of the laminated wiring board 20 and the MLCC 4. For this reason, the resin film is laminated on the stripped surface of the laminated wiring board 20. In this state, like the upper interlayer insulation layer 50, the upper interlayer insulation layer 51 also covers each of the main surfaces of the laminated wiring board 20 and the MLCC 4. As the resin film, the same type of resin film used for the first lamination may be used. This lamination is also preferably performed under reduced pressure.

The resin film formed through the second lamination is also pressed in a thickness direction of the board. Conditions such as temperature and pressure for the pressing performed after the second lamination may be the same as those for the pressing performed after the first lamination. That is, at this time, the upper interlayer insulation layers (50, 51) and the filling resin 5 have not yet been cured. During this second pressing, a portion of resin is filled into the gap between the wall surface 31 and the MLCC 4 from the newly laminated resin film, that is, the upper interlayer insulation layer 51.

On the other hand, this region is already filled with the filling resin 5 formed to be contiguous to the upper interlayer insulation layer 50 by the first pressing. At this time, the filling resin 5 is not yet cured. Therefore, the filling resin 5 from the upper interlayer insulation layer 50 will be pushed back slightly by the resin forced in from the upper interlayer insulation layer 51. As a result, after the second pressing, a state in which a region other than the region occupied by the MLCC 4 in the cavity 3 is entirely filled with resin is the same as before. Therefore, in the following description, the resin forced in from the upper interlayer insulation layer 50 and the resin forced in from the upper interlayer insulation layer 51 are not distinguished from each other and are collectively called the filling resin 5. However, strictly speaking, there is an interface between them.

At the time of a second lamination, the force of the resin to be forced in from a newly laminated upper interlayer insulation layer 51 is not necessarily the same on the four sides of the MLCC 4. When the position of the MLCC 4 in the cavity 3 is off center as described above, the distance between the MLCC 4 and the wall surface 31 of the cavity 3 varies depending on the sides of the MLCC 4. For a side with a longer distance, the force that forces in the resin from the upper interlayer insulation layer 51 is greater. By contrast, for a side with a smaller distance, the force that forces in the resin from the upper interlayer insulation layer 51 is weaker. That is, the off-center arrangement of the MLCC 4 in the cavity 3 is a factor that rotates the MLCC 4 during a second pressing and thus causes the MLCC 4 to incline. When the inclination is large, the electronic component and a conductive layer of the wiring board come into contact with each other within a region where filled vias are not formed.

However, in the present embodiment, the protrusions (32, 33) are partially formed in the wall surface 31 of the cavity 3 as described above. The protrusions (32, 33) are formed in both shorter sides of the cavity 3, that is, both sides facing the shorter sides of the MLCC 4. Accordingly, distances from both ends of the MLCC 4 in the longitudinal direction to the wall surface 31 are not extremely different from each other. Therefore, the inclination of the MLCC 4 in the longitudinal direction is suppressed in the present embodiment. Accordingly, the upper interlayer insulation layers (50, 51) are formed in the state in which the MLCC 4 is not severely inclined through the second pressing as shown in FIG. 9.

Curing

Subsequently, a curing treatment is performed. That is, a laminated wiring board 20 that has undergone a second lamination is heated to cure the thermosetting resin. Thereby, the MLCC 4 is fixed in the posture shown in FIG. 9. In the state shown in FIG. 9, the thickness of the upper interlayer insulation layer 51 after the pressing and curing is almost the same as that of the upper interlayer insulation layer 50 described above in a position other than on the edges of the MLCC 4.

Formation of Outer Layer and the Like

Figure 10:
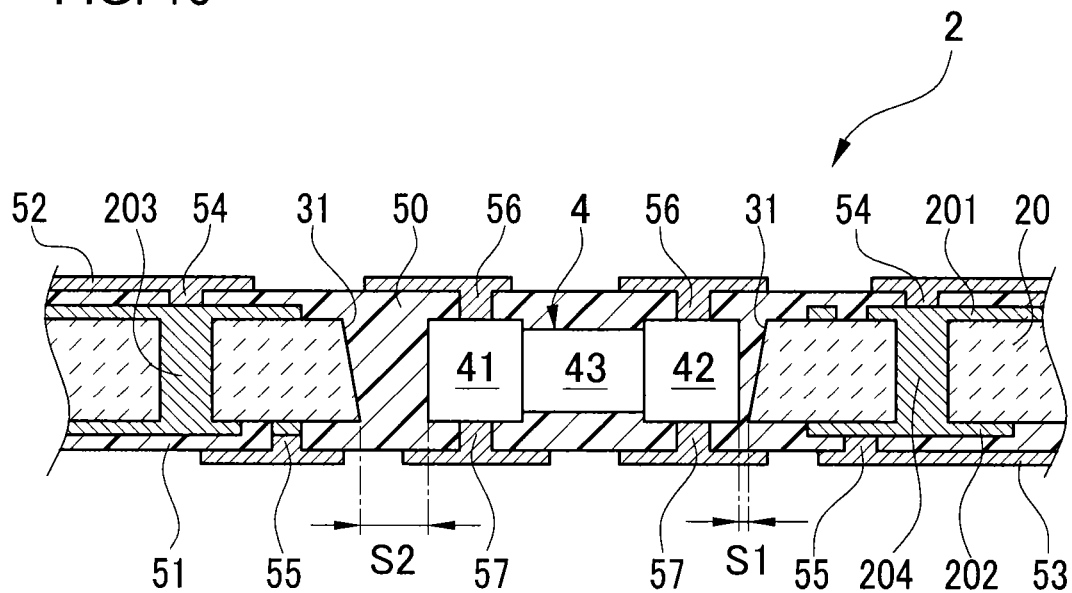
FIG. 10 is a cross-sectional view of the core wiring board in which an outer-layer pattern is formed.

Next, an outer-layer pattern and the like are formed, resulting in the state shown in FIG. 10. In the laminated wiring board 20 shown in FIG. 10, outer-layer wiring patterns (52, 53) are formed on the upper interlayer insulation layers (50, 51). Via holes (54, 55) to conduct electricity to the inner-layer wiring patterns (201, 202), respectively, and via holes (56, 57) to conduct electricity respectively to the electrodes (41, 42) of the MLCC 4, are formed in the outer-layer wiring patterns (52, 53), respectively. A diameter of the via holes (54 to 57) is approximately 50 to 80 μm.

Forming the via holes (54 to 57) in the upper interlayer insulation layers (50, 51) is performed by irradiating a laser. Alternatively, it can also be performed using photolithography and dissolution. The hole-opening process for the via holes (54 to 57) is made easier especially by using the upper interlayer insulation layers (50, 51) that do not contain glass cloth. However, even when the upper interlayer insulation layers (50, 51) contain glass cloth, making a via hole is not entirely impossible. Formation of a copper layer for the outer-layer wiring patterns (52, 53) is performed through electroless plating. Alternatively, the copper layer may be performed by using a copper-clad resin film for the resin film used at the time of "5. first lamination" and "6. second lamination."

Figure 11:
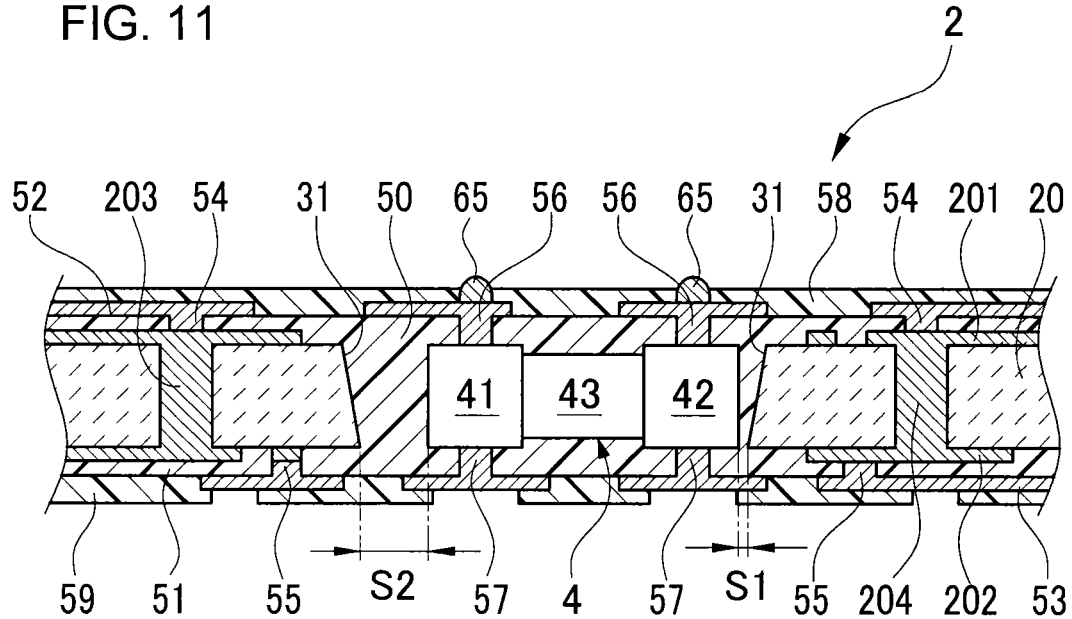
FIG. 11 is a cross-sectional view of the wiring board having a built-in electronic component and in which a protective insulation layer or the like is formed.

Then, protective insulation layers (58, 59) and bumps 65 are formed in a final step, resulting in the state shown in FIG. 11. Next, by checking the capacitance value of the MLCC 4 and insulation between each portion using an electric test instrument, manufacturing of the wiring board 1 with a built-in electronic component of the present embodiment is completed. The upper interlayer insulation layers (50, 51), the outer-layer wiring patterns (52, 53), and the protective insulation layers (58, 59) are collectively called "upper layers (61, 62)" in the description of FIG. 2.

Regarding the wiring board 1 with a built-in electronic component of the present embodiment manufactured in the way described above, the inclination of the MLCC 4 is suppressed as described above, and there are the following advantages. That is, there is no concern that the MLCC 4 and the outer-layer wiring patterns (52, 53) are in contact with each other in positions other than those of the via holes (56, 57). Since no short-circuiting occurs in a portion where electrical conduction is not supposed to occur, the insulation reliability of the upper interlayer insulation layers (50, 51) is high. Especially, the inclination of the MLCC 4 in a longer side direction is prevented by providing the protrusions (32, 33) in respective shorter sides of the wall surface 31 of the cavity 3. Naturally, the MLCC 4 tends to incline in the longer side direction; however, such an inclination is effectively prevented by an embodiment of the present invention.

In the wiring board 1 with a built-in electronic component according to the present embodiment, as described in detail above, the protrusions (32, 33) are partially provided in the wall surface 31 of the cavity 3 in which the MLCC 4 is accommodated. This structure allows the arrangement of the MLCC 4 in the cavity 3 not to be extremely off center. Even when the MLCC 4 is positioned off center, a certain amount of space is secured in the gap with a shorter distance. Therefore, the degree of push-back force of the resin from a new resin film when the pressing is performed after a second lamination does not differ greatly between the gap with the distance (S1) and the gap with the distance (S2). In this way, the inclination of the MLCC 4 is suppressed when the formation of the upper interlayer insulation layers (50, 51) is finished. This prevents parts of the upper interlayer insulation layers (50, 51) from being too thin, thereby improving the insulation reliability of the upper interlayer insulation layers.

Figure 12:
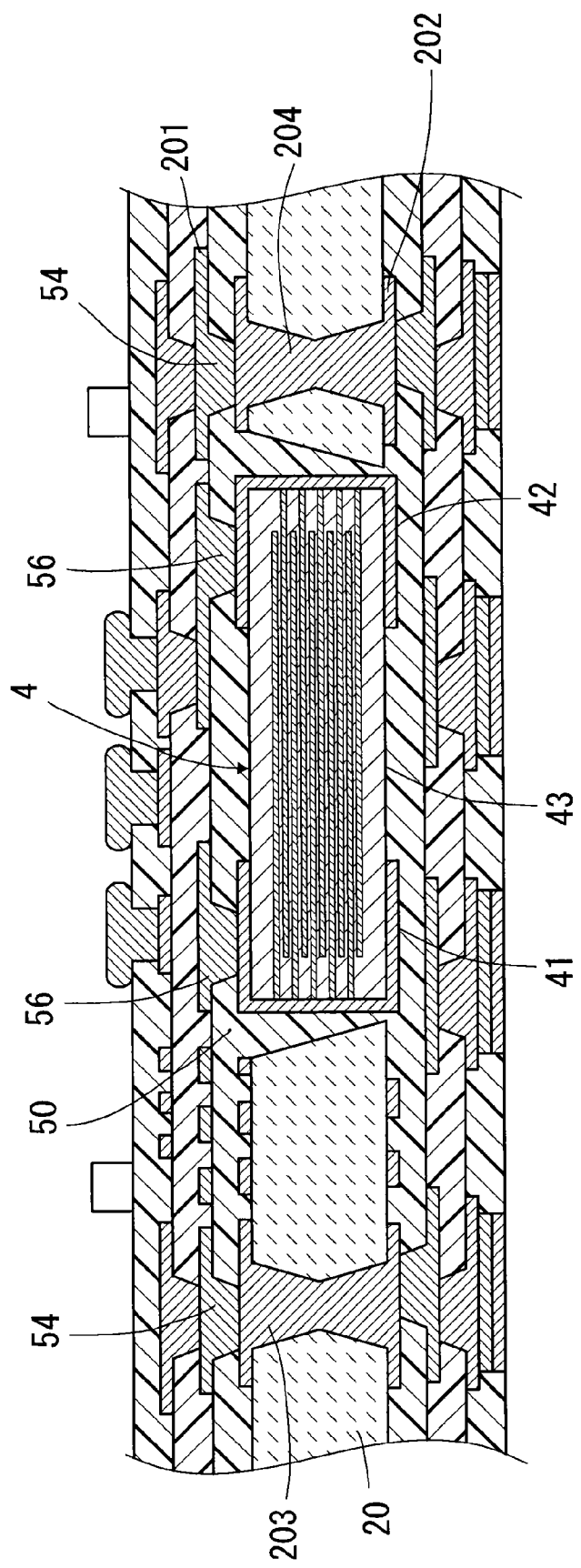
FIG. 12 is a cross-sectional view showing an example in which two upper interlayer insulation layers are formed in each of a front surface and a back surface.

The present embodiment is an example, and the present invention is not limited to such an embodiment. Therefore, naturally various changes and modifications are possible for the present invention without deviating from the gist of the present invention. For example, the electronic component accommodated in the cavity 3 is not limited to an MLCC, and any other type may be used as long as it is shaped like a flat plate. Although FIG. 10 illustrates an example in which the via holes (56, 57) are provided in both of the outer-layer wiring patterns (52, 53) so as to be connected to the MLCC 4, the present invention is not limited to such a structure. Only either the outer-layer wiring pattern 52 or the outer-layer wiring pattern 53 may be connected to the MLCC 4. Yet alternatively, only one outer-layer wiring pattern (52 or 53) may be formed. In addition, as shown in FIG. 12, two upper interlayer insulation layers may be laminated on each of the front and back surfaces.

Figure 13:
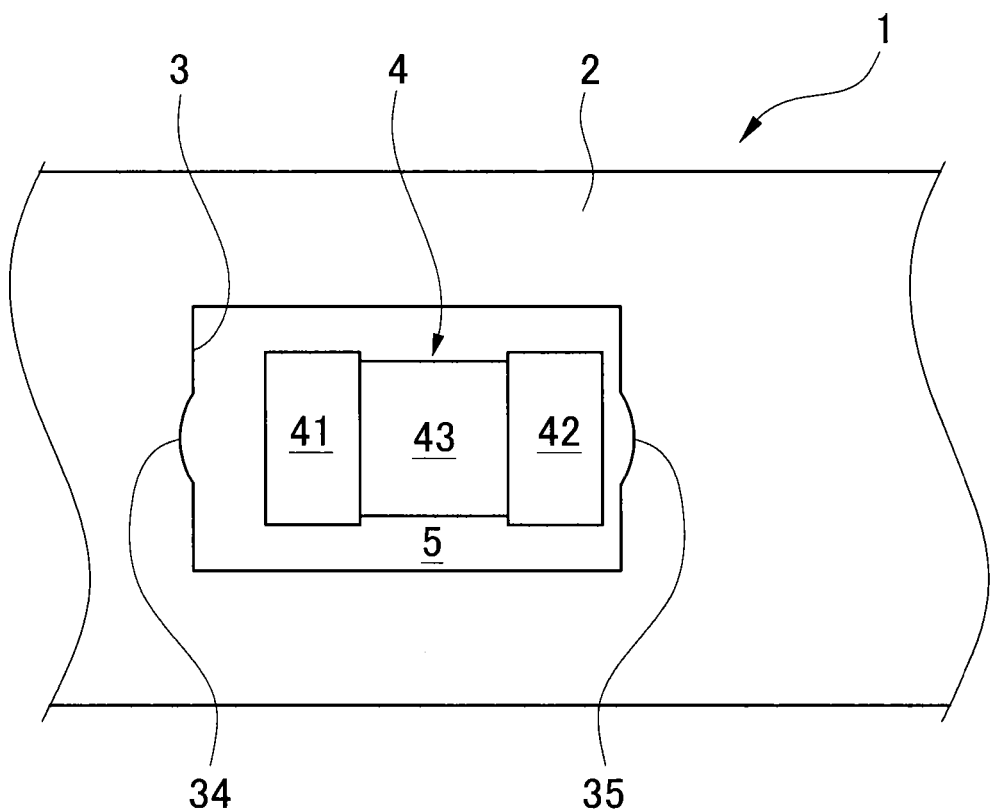
FIG. 13 is a plan view showing an example in which a notch portion instead of a protrusion is formed in the wall surface of the cavity.
Figure 14:
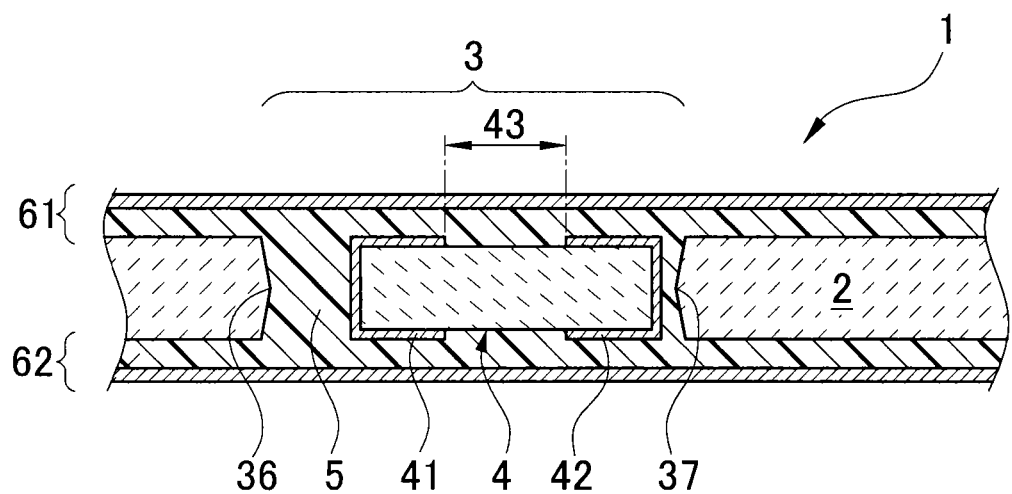
FIG. 14 is a cross-sectional view showing an example in which part of the wall surface of the cavity protrudes in a thickness direction.

Although the protrusions (32, 33) formed in the wall surface 31 of the cavity 3 have an arc shape in a plan view, that is not the only option for the shape of the protrusions (32, 33). They may have a triangular shape, a rectangular shape, a trapezoidal shape or the like. That is, the shape of the protrusions (32, 33) in a plan view may be any shape, for example, a shape with a curved surface or a polygonal shape. As shown in FIG. 13, notch portions (34, 35) may be provided instead of protrusions. The notch portions (34, 35) are portions that are partially recessed in the wall surface 31 of the cavity 3 in positions corresponding to the MLCC 4. Even by providing the notch portions (34, 35) instead of the protrusions, a certain amount of space can be secured in the gap with a shorter distance, and the same effect can be obtained. Of course, the shape of the notch portions is not limited to an arc shape, and may be any of the shapes described above. Also, the number of protrusions (or notch portions) per side of the wall surface 31 of the cavity 3 is not limited to one. Alternatively, as shown in the cross-sectional view of FIG. 14, protrusions (36, 37) partially protruding in a thickness direction may be provided. For example, such a cross-sectional shape for the cavity 3 is formed by irradiating a laser beam from the upper and lower surfaces of the wiring board.

Although the protrusions (32, 33) provided in the wall surface 31 of the cavity 3 are formed in the shorter sides opposite each other in the present embodiment, the protrusions or notch portions may also be formed in the longer sides opposite each other. With such a structure, the inclination of the MLCC 4 is suppressed in the shorter sides instead of the longer sides, but that is also effective. Furthermore, it may be more preferred to provide the protrusions for all sides of the wall surface 31, thereby suppressing the inclination in both of the longer side direction and the shorter side direction.

On the other hand, the protrusions or notch portions are not necessarily formed in opposite sides of the wall surface 3. A structure in which the protrusion or notch portion is formed only in either one of two opposite sides is also somewhat effective. Especially when the direction of the off-center position of the MLCC 4 is mostly determined, it is sufficient, in some cases, for the protrusion or notch portion to be formed only in the side of the cavity that tends to have a small distance to the MLCC 4.

Figure 15:
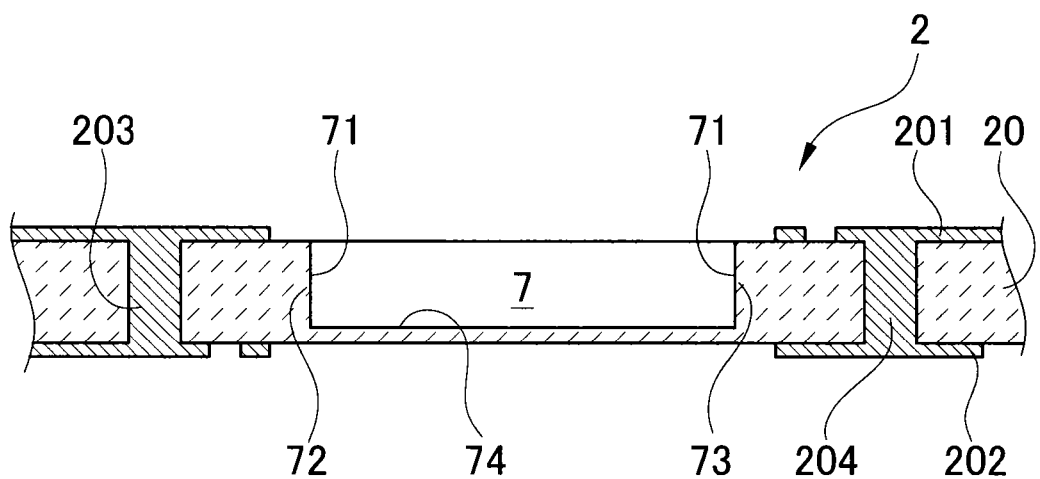
FIG. 15 is a cross-sectional view showing an example that uses a closed-end hole as the cavity instead of a through hole.

Although the cavity 3 is formed as a through hole in the present embodiment (see FIG. 4, etc.), a closed-end hole may be used instead of a through hole. For this case, a state corresponding to the state shown in FIG. 4 is shown in FIG. 15. In this case, the MLCC 4 is placed on a bottom 74 of a closed-end hole 7 formed in the laminated wiring board 20. As shown in FIG. 15, although the closed-end hole 7 has an opening in an upper surface, the closed-end hole 7 has a bottom in a lower surface and does not have an opening in the lower surface. When the closed-end hole 7 is seen from above, it has a shape having protrusions (72, 73) similar to the cavity 3 shown in FIG. 1. Alternatively, it may have a shape provided with notch portions instead of the protrusions as shown in FIG. 13. The upper interlayer insulation layer is laminated only to the upper surface in FIG. 15. That is, the first lamination is not performed; only the second lamination is performed. Thereby, the surfaces of the laminated wiring board 20 and the MLCC 4 on the opening side of the closed-end hole 7 are covered by the upper interlayer insulation layer. An adhesive tape is not used.

Even in this case, if the distance between the MLCC 4 and a wall surface 71 is significantly uneven, the MLCC 4 is slightly pushed upward in the gap with a longer distance, and thus the MLCC 4 inclines. Such an inclination is caused when the filling resin that is strongly forced in between the MLCC 4 and the wall surface 71 enters between the MLCC 4 and the bottom 74. However, in this case, the protrusions (72, 73) or notch portions suppress the inclination, similar to the previously described case in which a through hole was used.

When an electronic component accommodated in the cavity inclines with respect to a wiring board, depending on the degree of inclination, the electronic component and a conductive layer of the wiring board may come into contact with each other within a region where filled vias are not formed.

The inclination of such an electronic component occurs when the filling resin enters a gap between a wall surface of the cavity and the electronic component. Such inclination is caused by a difference in the amount of resin in the gap among the four sides of the electronic component. In a position where a large amount of resin is forced in, the electronic component is pushed in a direction in which the resin is forced. In a position where a small amount of resin is forced in, the electronic component is pushed not nearly as much. The amount of resin forced into the gap depends on the width of the gap. A large amount of resin is introduced into a wide gap while only a small amount of resin is introduced into a narrow gap. Accordingly, the electronic component is inclined in a direction to which a side of the electronic component facing the wide gap is pushed along with the resin.

Also, the cavity is formed larger than the electronic component accommodated in the cavity. The dimensional relationship is set in consideration of working accuracy and ease of accommodation. The exact position of the electronic component in the cavity may vary depending on individual products. The state of the inclination of the electronic component in the completed product varies depending on individual products. Some products may have a larger inclination angle.

According to an embodiment of the invention, a wiring board has a built-in electronic component and can suppress an inclination of an electronic component accommodated in a cavity with respect to a wiring board, and a method of manufacturing the same.

A wiring board with a built-in electronic component according to one aspect of the present invention includes the following: a core substrate having a cavity formed to open in at least one surface; an electronic component accommodated in the cavity and having conductive portions on an upper surface; filling resin to fill space between a wall surface of the cavity and the electronic component; and a resin insulation layer structured to cover surfaces of the core substrate and the electronic component on the side in which the cavity is open. In such a wiring board, part of at least one side of a wall surface of the cavity protrudes toward the electronic component, or part of at least one side of a wall surface of the cavity is recessed away from the electronic component, and the distance between the wall surface of the cavity and the electronic component differs between the position of the protrusion or the position of the recess and the rest of the wall surface.

A wiring board with a built-in electronic component according to an embodiment of the present invention is manufactured by positioning an electronic component in a cavity of a core substrate in which the cavity is formed to open on at least one surface, and causing resin to flow into a gap between the wall surface of the cavity and the electronic component in order to fill the gap with the resin. To employ such a method, a core substrate is used, in which part of at least one side of a wall surface of the cavity protrudes toward the electronic component, or part of at least one side of a wall surface of the cavity is recessed away from the electronic component.

In the wiring board with a built-in electronic component, the core substrate having a protrusion or a recess in at least one side of the wall surface of the cavity is used. Therefore, even though the position of the electronic component accommodated in the cavity is shifted from the center of the cavity, the difference in the distance from the wall surface of the cavity to each of the four sides of the electronic component is reduced. Accordingly, when an upper resin insulation layer is laminated, the difference is reduced in the amount of the filling resin forced into the gap between the electronic component and each side of the wall surface of the cavity. As a result, the inclination of the electronic component is suppressed after the lamination of an upper layer, and a wiring board is obtained which has a built-in electronic component and highly reliable insulation between the electronic component and other portions.

In a wiring board with a built-in electronic component according to an embodiment of the present invention, protrusions or recesses may be formed on at least two sides of the cavity which are opposite each other. Thereby, even though the electronic component is positioned off center to be near either one of two opposite sides, the difference in the distance between each side of the cavity and the electronic component is reduced.

In a wiring board with a built-in electronic component according to an embodiment of the present invention, the shape of the cavity in a plan view of the core substrate may be a rectangle and the protrusion or recess may be formed on a shorter side of the cavity. Thereby, the inclination of the electronic component in a longer side direction is effectively suppressed.

When the filling resin is contiguous to the resin insulation layer without forming an interface (a portion of the filling resin flows into the gap between the electronic component and the wall surface of the cavity when the resin insulation layer is laminated), the electronic component is likely to incline.

In a wiring board with a built-in electronic component according to an embodiment of the present invention, an upper conductive layer may be further provided on the resin insulation layer, and a via which electrically conducts between the conductive portion of the electronic component and the upper conductive layer may be formed in the resin insulation layer. A wiring board with a built-in electronic component according to an embodiment of the present invention not only prevents short-circuiting between the electronic component and the upper conductive layer in positions other than the via holes, but also secures electrical conduction.

In a wiring board with a built-in electronic component according to an embodiment of the present invention, the protrusion or the recess may be formed by a cut plane formed when a portion of the core substrate corresponding to the cavity is removed from the core substrate. That is, the protrusion or the recess may not be formed by an added part, but either of them may be integrally formed as a portion of the core substrate. Such a process leads to a reduction in the number of parts or processing steps. A specific example of the electronic component is a laminated ceramic capacitor in which a conductive portion extends from a side surface to a main surface.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
    a core substrate having a cavity portion and at least one side wall forming the cavity portion, the at least one side wall extending from a first surface of the core substrate to a second surface opposite to the first surface;
    an electronic component accommodated in the cavity portion of the core substrate and comprising a body portion and a plurality of conductive portions formed on a surface of the body portion;
    a filling resin filling a space formed in the cavity portion having the electronic component positioned in the cavity portion; and
    a resin insulation layer formed on the core substrate such that the resin insulation layer is covering an opening of the cavity portion and a surface of the electronic component,
    wherein the core substrate has an inclination suppressing structure formed on the at least one side wall forming the cavity portion such that a distance between the side wall forming the cavity portion and the electronic component varies in a first portion of the side wall having the inclination suppressing structure and a second portion of the side wall other than the first portion having the inclination suppressing structure, the inclination suppressing structure comprises a protrusion portion protruding toward the electronic component from the side wall forming the cavity portion or a recess portion recessed away from the electronic component; and the inclination suppressing structure is formed such that when one of the first and second portions comes into contact with the electronic component, the other of the first and second portions is separated from the electronic component by a gap which extends along the side wall from the first surface to the second surface of the core substrate.

2. The wiring board with the built-in electronic component according to claim 1, wherein the inclination suppressing structure comprises a protrusion portion protruding toward the electronic component from the side wall forming the cavity portion.

3. The wiring board with the built-in electronic component according to claim 1, wherein the inclination suppressing structure comprises a recess portion recessed away from the electronic component.

4. The wiring board with the built-in electronic component according to claim 1, wherein the inclination suppressing structure comprises a plurality of protrusion portions each protruding toward the electronic component from a plurality of side walls forming the cavity portion on opposite sides, respectively.

5. The wiring board with the built-in electronic component according to claim 1, wherein the inclination suppressing structure comprises a plurality of recess portions recessed away from the electronic component and formed in a plurality of side walls forming the cavity portion on opposite sides, respectively.

6. The wiring board with the built-in electronic component according to claim 2, wherein the cavity portion of the core substrate has a rectangle shape such that the protrusion portion is formed in the side wall forming a shorter side of the cavity portion.

7. The wiring board with the built-in electronic component according to claim 3, wherein the cavity portion of the core substrate has a rectangle shape such that the recess portion is formed in the side wall forming a shorter side of the cavity portion.

8. The wiring board with the built-in electronic component according to claim 1, further comprising:
    a conductive layer formed on the resin insulation layer; and
    a via hole conductor formed through the resin insulation layer such that the via hole conductor is connecting one of the conductive portions of the electronic component and the conductive layer.

9. The wiring board with the built-in electronic component according to claim 1, wherein the inclination suppression portion comprises a portion of the side wall formed by cutting and removing a portion of the core substrate corresponding to the cavity portion.

10. The wiring board with the built-in electronic component according to claim 1, wherein the electronic component is a multi-layer ceramic capacitor, and the conductive portions are formed on a dielectric body portion of the multi-layer ceramic capacitor such that the conductive portions are extending from one surface of the dielectric body portion to an opposite surface through side surfaces of the dielectric body portion, respectively.

* * * * *